(12) United States Patent
Acklin et al.

(10) Patent No.: US 6,835,603 B2
(45) Date of Patent: Dec. 28, 2004

(54) METHOD FOR PRODUCING SEMICONDUCTOR LASER COMPONENTS

(75) Inventors: Bruno Acklin, Palo Alto, CA (US); Stefan Grötsch, Regensburg (DE)

(73) Assignee: Osram Opto Semiconductors GmbH & Co. OHG, Regensburg (DE)

( * ) Notice: Subject to any disclaimer, the term of this patent is extended or adjusted under 35 U.S.C. 154(b) by 610 days.

(21) Appl. No.: 09/932,878

(22) Filed: Aug. 20, 2001

(65) Prior Publication Data

US 2003/0211708 A1 Nov. 13, 2003

(30) Foreign Application Priority Data

Aug. 18, 2000 (DE) ......................................... 100 40 450

(51) Int. Cl.[7] .............................................. H01L 21/50
(52) U.S. Cl. ...................................... 438/122; 438/113
(58) Field of Search .......................... 438/119, 42, 107, 438/108, 121, 122, 113

(56) References Cited

U.S. PATENT DOCUMENTS 6,281,032 B1 * 8/2001 Matsuda et al. .............. 438/42
6,479,325 B2 * 11/2002 Ozawa ....................... 438/119

FOREIGN PATENT DOCUMENTS

| DE | 40 17 698 A1 | 12/1991 |
| DE | 43 19 944 A1 | 12/1994 |
| DE | 196 44 941 C1 | 1/1998 |
| DE | 198 21 544 A1 | 12/1999 |
| DE | 198 27 414 A1 | 12/1999 |

OTHER PUBLICATIONS

L. J. Missaggia et al.: "Microchannel Heat Sinks for Two–Dimensional High–Power–Density Diode Laser Arrays", IEEE Journal of Quantum Electronics, vol. 25, No. 9, Sep. 1989, pp. 1988–1992.

Data sheet for laser diode SPL CGxx, xx=81, 94 or 98, Osram Opto Semiconductors, Jan. 1, 2000.

* cited by examiner

Primary Examiner—Long Pham
Assistant Examiner—(Vikki) Hoa B. Trinh
(74) Attorney, Agent, or Firm—Laurence A. Greenberg; Werner H. Stemer; Gregory L. Mayback

(57) ABSTRACT

A method for producing semiconductor laser components in which, a number of chip mounting areas are formed on a cooling element having an electrically insulating carrier that is in the form of a plate. A number of semiconductor laser chips are then fit to the cooling element, with one semiconductor laser chip being arranged on each chip mounting area. Finally, the cooling element, with the semiconductor bodies fit on it, is subdivided into a number of semiconductor laser components.

29 Claims, 3 Drawing Sheets

METHOD FOR PRODUCING SEMICONDUCTOR LASER COMPONENTS

BACKGROUND OF THE INVENTION

FIELD OF THE INVENTION

The invention relates to a method for producing semiconductor laser components which each have a cooling element.

During the steady-state operation of a semiconductor component, in order to prevent the temperature of the semiconductor body of the component from rising, the amount of heat produced by power losses is continuously emitted to the environment. Semiconductors with very high power losses, such as laser diodes, require very efficient cooling apparatuses to ensure that the heat losses which occur are transported adequately from the semiconductor body to the environment. This heat transport is necessary in order to keep the temperature of the semiconductor body sufficiently low such that the semiconductor body is not damaged or degraded during operation. Power semiconductors such as laser diodes having a high output power are thus in some cases fit to a suitable heat sink even during production. This can be seen in the relative component datasheets (see, for example, the datasheet for the SPL CGxx laser diode, xx=81, 85, 94 or 98, Osram Opto Semiconductors, Jan. 1, 2000).

In one conventional production method for semiconductor laser components, the semiconductor bodies are separated and are then soldered onto a metallic heat sink, and contact is made with them. This method requires both the individual heat sinks and the individual semiconductor bodies to be supplied to the component placement apparatus and to be positioned with respect to one another. Furthermore, the components cannot be tested until the end of this production method, since, for many test procedures, the component must already have been cooled sufficiently at the time when the test is carried out. Otherwise, there is a risk of the component being damaged by the excessively large amount of heat developed when the test procedure is carried out.

SUMMARY OF THE INVENTION

It is accordingly an object of the invention to provide a method for producing semiconductor laser components which overcomes the above-mentioned disadvantageous of the prior art methods of this general type, and which in particular, allows the semiconductor bodies to be mounted at low cost and in a simple manner.

With the foregoing and other objects in view there is provided, in accordance with the invention, a method for producing semiconductor laser components, that includes a step of: providing a cooling element having an electrically insulating carrier that is formed as a plate having a main surface which is covered by a metal coating. The metal coating is then structured to form a number of chip mounting areas. In the next step, semiconductor laser chips are fit to these chip mounting areas, with one semiconductor laser chip being arranged on each chip mounting area. Finally, the semiconductor laser components are separated. This is done by subdividing the cooling element into a number of semiconductor laser components, with the semiconductor laser chips fit to them. The semiconductor laser components formed in this way each have at least one semiconductor laser chip and a part of the cooling element as a heat sink.

The structuring of the cooling element to form the chip mounting areas may include the formation of individual metal surfaces, including any surface treatments and solder coatings, and the formation of interconnects on the carrier. Furthermore, weak points may be formed in the carrier during this step.

In the case of the invention, the semiconductor laser chips are mounted on the cooling element before they are separated. This simplifies the mounting process, since the cooling element need be positioned only once for fitting a number of semiconductor bodies. Furthermore, the positioning of the semiconductor bodies is simplified, since, in contrast to cooling elements which have already been separated, the cooling element represents a very accurately defined mounting platform.

Since the number of positioning steps is reduced and it is easier to position the semiconductor bodies, the method can be carried out easily and at low cost.

In accordance with an added feature of the invention, the semiconductor bodies are tested in a further step before being separated, in which case the test time and the conversion time are advantageously kept short.

In accordance with an additional feature of the invention, optical elements for carrying the radiation produced or the radiation to be detected are mounted on the carrier, in a further step, before the separation process. These elements may be, for example, collimation optics for the generated laser radiation and elements for light injection into glass fibers, including the fiber retention mechanism. These elements must be aligned exactly with the semiconductor body. Since the mounting platform is defined accurately, and the positioning accuracy is hence also high, this can be done with high precision using the invention.

In accordance with another feature of the invention, the chip mounting areas are arranged in a matrix form. This is particularly advantageous when using automatic component placement machines, in order to keep the positioning times short.

In accordance with a further feature of the invention, the chip mounting areas are in the form of metal surfaces on the carrier. This allows the semiconductor bodies to be connected to the cooling element by soldered joints, which at the same time have very good electrical and thermal conductivity. Furthermore, since their thermal conductivity is high, the metal surfaces allow the heat to be distributed uniformly in the carrier located underneath, thus allowing heat to be transported efficiently.

In accordance with a further added feature of the invention, connecting pads are formed on the metal surfaces which form the chip mounting areas, and the semiconductor bodies are fit and mounted on them (chip connecting pads). These connecting pads are advantageously covered with an electrically and thermally conductive adhesion means such as a solder. This allows the invention to be used in automatic component placement machines, with reliable soldered joints being produced automatically in the process.

In accordance with a further additional feature of the invention, interconnect structures are formed on the carrier of the cooling element. In this case, subareas of the interconnect structures are used as connecting pads for wire connections which make electrical contact with the semiconductor bodies (wire connecting pads). It is a major advantage that the interconnects can be used to actuate the semiconductor bodies electrically, so that their functionality can be tested before they are separated. In contrast, components according to the prior art cannot be tested until after they have been separated, since the heat sink is not fit until after the separation process and the component must be cooled adequately for many test procedures.

The advantage of testing before separation is that the test apparatus need be connected to the interconnect system only once for a number of components and thus the test times are reduced. One particular advantage is that a number of components can be tested simultaneously. Depending on the configuration of the interconnects on the cooling element, it is in this case possible to carry out individual tests, group tests or a simultaneous test of all the semiconductor bodies that have been installed. These test options are particularly advantageous because of their flexibility and the time that is saved when they are carried out simultaneously. The term test procedure in this case refers to functional tests, aging and life tests and, in particular, to forming cycles, which are also referred to as "burn-in", some of which are carried out at full load and are thus generally feasible only when sufficient cooling is provided.

In accordance with yet an added feature of the invention, metallic surfaces are likewise formed on the second main surface of the carrier, and are associated with the chip mounting areas on the first main surface. The layered structure of metal-carrier-metal formed in this way is distinguished by efficient heat transport, with low and homogeneous thermal expansion at the same time. If the metals and the carrier material together with the respective layer thicknesses are chosen appropriately, the coefficient of expansion of the cooling element can be matched precisely to the thermal coefficient of expansion of the semiconductor body. This matching is a highly advantageous way of avoiding thermal alternating loads leading to stresses in the soldered joints between the semiconductor body and the cooling element, which can lead to the soldered joints fracturing.

A ceramic material with high thermal conductivity, such as AlN or BN, is preferably used as the carrier material. An AlN carrier can advantageously be connected to a copper coating. Such direct bond copper materials (DBC) are distinguished by high thermal conductivity, while at the same time have low thermal expansion. It is particularly advantageous in this case that, if designed appropriately, the assembly has a thermal coefficient of expansion which is virtually the same as the thermal coefficient of expansion of GaAs. When using a DBC material, the invention is thus particularly suitable for use as a cooling element for GaAs semiconductor bodies, such as laser diodes based on GaAs and having a high output power.

In accordance with yet an additional feature of the invention, weak points are formed between the areas for accommodating the semiconductor bodies. After being mounted and, if appropriate, after carrying out the test procedures, the cooling element can thus easily be subdivided by fracturing it.

In accordance with yet another feature of the invention, the carrier has a number of layers, and the coating which is adjacent to the first main surface is electrically insulating. A multilayer carrier can be matched very well to the semiconductor body and to the intended field of use of the component, in terms of the expansion behavior, the mechanical strength and the thermal conductivity.

In accordance with a concomitant feature of the invention, the metal coating on the carrier, the chip mounting areas and, if appropriate, the associated surfaces on the opposite main surface are in the form of a number of layers. Surface treatment of the metallic surfaces, in the form of a thin noble-metal coating, is particularly advantageous in this case. Such surface treatment improves the solderability of the metal surfaces, while at the same time providing corrosion protection.

Other features which are considered as characteristic for the invention are set forth in the appended claims.

Although the invention is illustrated and described herein as embodied in a method for producing semiconductor laser components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
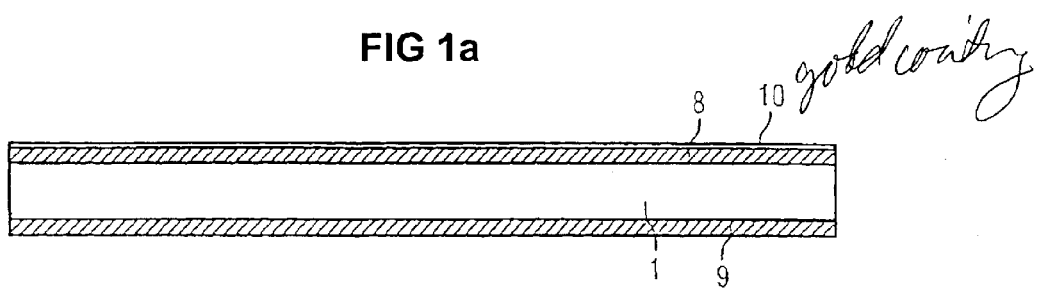
FIGS. 1a, 1b, 1c and 1d schematically illustrate an exemplary embodiment of a method for producing semiconductor laser components.

Referring now to the figures of the drawing in detail and first, particularly, to FIG. 1 thereof, there is shown an exemplary embodiment of a method for producing semiconductor laser components. Direct bond copper material (DBC) is used as the initial product in FIG. 1a. This multilayer material includes a ceramic carrier 1 that is composed of AlN for example. The ceramic carrier 1 has a main surface that is covered with a first copper coating 8 and an opposite main surface that is coated with a second copper coating 9. A gold coating 10 is electrochemically deposited as a surface treatment on the first copper coating 8.

Figure 1B:
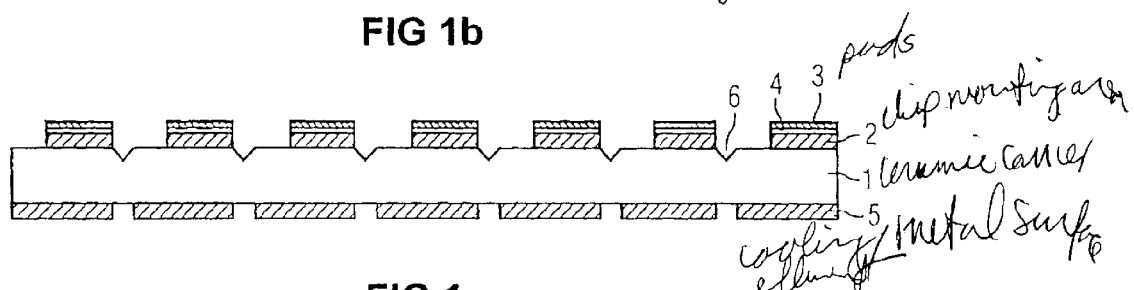

This DBC material is structured in a first production step, as shown in FIG. 1b. The structuring includes the formation of chip mounting areas 2, on which semiconductor laser chips will later be mounted. Chip connecting pads 3 are applied to the gold metallization 4 that is on the chip mounting areas 2. Also during the structuring process, weak points 6 are produced, and the second copper coating 9 is split into individual surfaces 5, which are associated with the chip mounting areas 2, and which, for example, are arranged opposite the chip mounting areas 2.

The chip connecting pads 3 may be produced, for example, by vapor deposition or by sputtering an AuSn solder, with the aid of a shadow mask on the gold coating. Alternatively, individual, appropriately shaped AuSn sheet parts can also be melted onto the gold metallization 4.

For structuring, the closed copper surfaces 8 and 9 together with the gold surface 10 are subdivided by selectively etching them into individual metal surfaces, which form the chip mounting areas 2 for accommodating the semiconductor laser chips, and the associated surfaces 5. During this etching process, interconnect structures can also be formed on the carrier 1 (not shown in the figure).

The weak points 6 can be milled or scratched as indentations into the etched-free surface of the carrier 1. The weak points 6 can be formed without making any physical contact by laser ablation, for example.

Figure 1C:
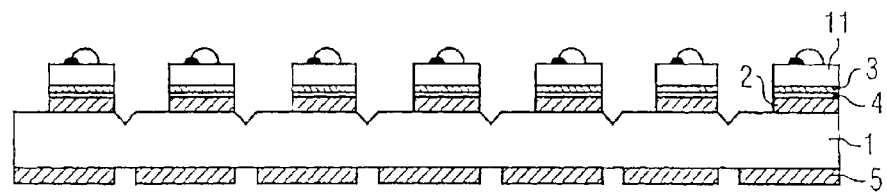
Figure 1D:
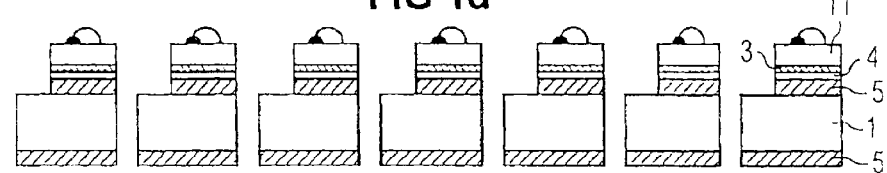

The semiconductor bodies 11, for example GaAs high-power laser diodes, are soldered onto the chip connecting pads 3, and are made contact with, in a second step after this structuring step (See FIG. 1c).

One particular advantage of the method is that optical elements can be fit to the carrier 1 during installation and before the separation process, and as described above, can be aligned with high precision with respect to a respectively associated semiconductor body 11.

After this step, the test procedures can be carried out on semiconductor components produced in this way, while they are still in the assembly. Those semiconductor components which are identified as being defective during this process can advantageously be segregated in a subsequent step before being installed in packages. Furthermore, the test procedures which are carried out make it possible to use quality criteria to select, for example, the components with the maximum output power or expected life, after they have been separated.

In the final step of the production method, the components are separated by fracturing at the weak points (FIG. 1d), after which further processing steps can be carried out, such as further mounting, installation in appropriate packages, or packing.

Both the production of the semiconductor laser components and their function are significantly influenced by the shape of the cooling element. Advantageous exemplary embodiments of structured cooling elements, such as those which are formed when using the invention, are shown in FIGS. 2 to 5.

Figure 2:
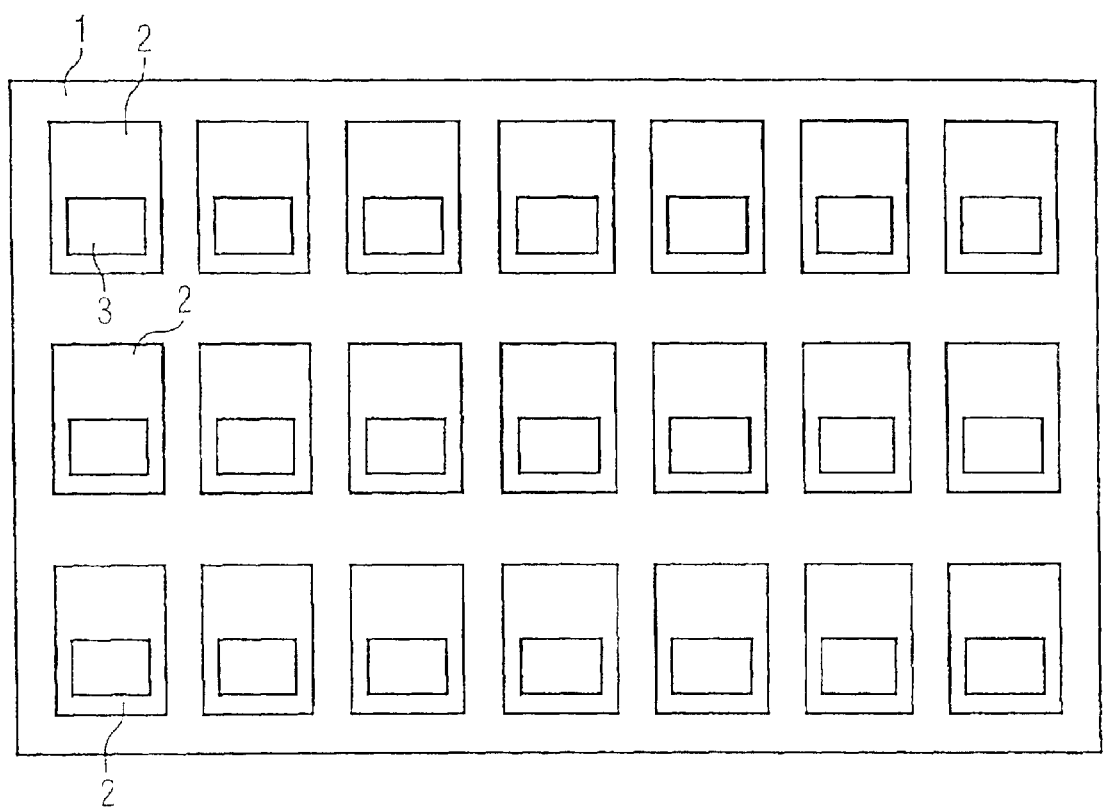
FIG. 2 schematically illustrates a first exemplary embodiment of a cooling element.

FIG. 2 shows a plan view of a structured cooling element before the semiconductor laser chips are fit. The cooling element has an electrically insulating ceramic carrier 1 in the form of a ceramic plate which is composed, for example, of an aluminum nitride ceramic, a boron nitride ceramic or a ceramic based on AlN or BN.

A number of rectangular chip mounting areas 2 in the form of copper surfaces for accommodating the semiconductor bodies are formed on one main surface of this carrier. Smaller areas, onto which the semiconductor bodies are soldered, are in turn formed as chip connecting pads 3 on these copper surfaces 2. These smaller areas may be, for example, a solder coating formed with boundaries.

An AuSn solder is particularly suitable for producing soldered joints that have high strength with high electrical and thermal conductivity at the same time for semiconductor laser chips based on GaAs, which may include, in particular, GaAs, AlGaAs, InGaAs, AlInGaAs. A hard-soldered joint produces a joint which is mechanically particularly robust and has high thermal conductivity.

The combination of a ceramic carrier with copper coatings applied to it advantageously results in a cooling element whose thermal coefficient of expansion is well matched to the thermal coefficient of expansion of GaAs. The thermal coefficient of expansion of GaAs is approximately 6.5 ppm/° C. A cooling element with an AlN ceramic carrier, which is covered with a copper coating on both sides, allows a thermal coefficient of expansion of between 4 ppm/° C. and 7 ppm/° C. to be achieved, and this is very well matched to the thermal coefficient of expansion of GaAs. The copper coatings are each approximately half as thick as the ceramic carrier between them. For example, the ceramic carrier may have a thickness of 0.6 mm, and be covered on both sides by a copper coating having a thickness of 0.3 mm. In contrast, copper has a thermal coefficient of expansion of approximately 17 ppm/° C., so that a solid cooling element composed of copper would not be nearly as well thermally matched to a GaAs semiconductor body.

The arrangement of the chip mounting areas 2 in a matrix form means that the illustrated cooling element can easily be fit with semiconductor bodies with an automatic machine. In this case, cooling element sizes of 100 mm×100 mm up to 100 mm×200 mm may be used for industrial purposes, in which case up to 200 individual chip mounting areas 2, for example, can be formed on each cooling element.

Figure 3:
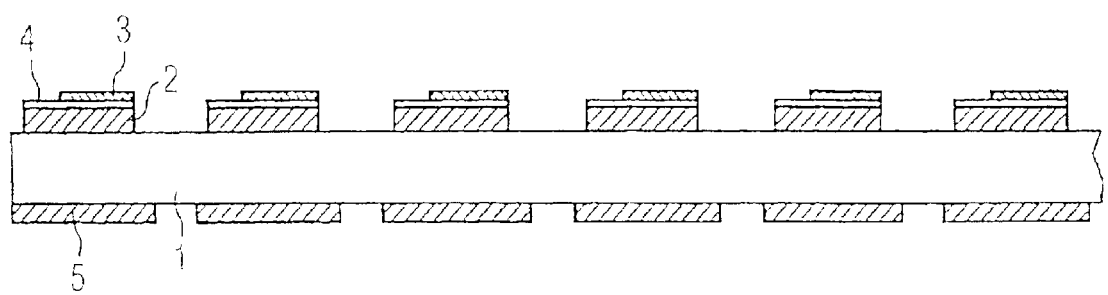
FIG. 3 schematically illustrates a second exemplary embodiment of a cooling element.

In the exemplary embodiment of a structured cooling element as shown in the form of a section in FIG. 3, metal surfaces 5 are likewise formed on the opposite main surface of the carrier 1 and are associated with the metal surfaces 2 such that this results in a multilayer, symmetrical assembly of metal-ceramic-metal, which has homogeneous and low thermal expansion. Furthermore, the metal surfaces 5 provide good thermal transmission to the mounting surface of the component and to further, possibly active, cooling systems such as fans.

The metallic surfaces forming the chip mounting areas 2 in this exemplary embodiment have a surface treatment in the form of an electrochemically deposited gold coating 4, in order to achieve particularly good soldering characteristics, especially in conjunction with AuSn solder. The chip connecting pads 3 that are covered with AuSn solder are once again formed on the gold coating.

Figure 4A:
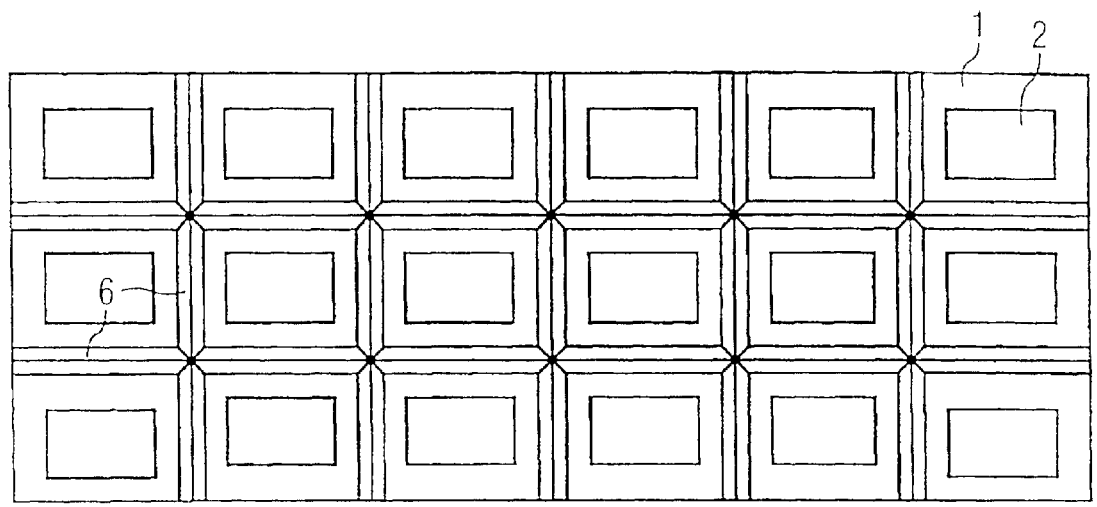
FIGS. 4a and 4b schematically illustrate a third exemplary embodiment of a cooling element.
Figure 4B:
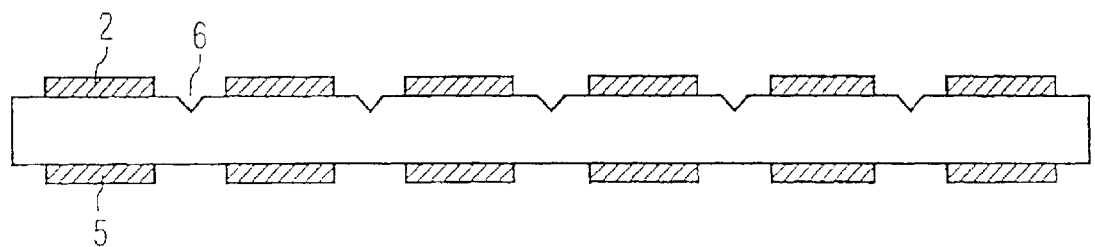

A plan view of an exemplary embodiment of a structured cooling element is shown in FIG. 4a and a sectional view is shown in FIG. 4b. This exemplary embodiment differs from the exemplary embodiment shown in FIG. 1 in that indentations are formed between the individual chip mounting areas 2 in the carrier 1, and act as weak points 6. Together with the brittle mechanical characteristics of a ceramic carrier material, this means that it is particularly easy to separate the components by fracturing. The weak points can in this case be produced without physical contact by means of laser ablation, or mechanically by milling or scratching.

Figure 5:
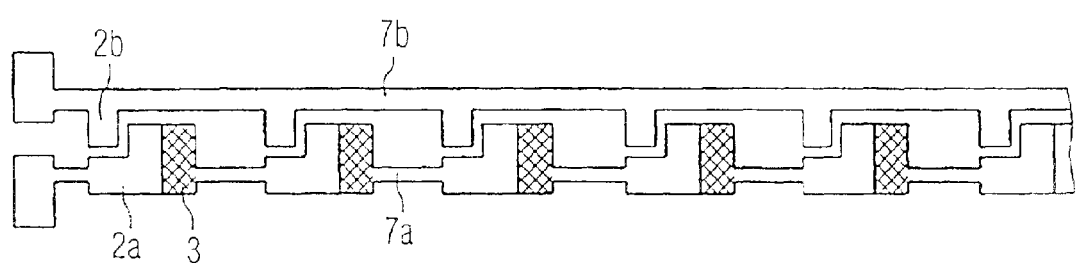
FIG. 5 schematically illustrates a fourth exemplary embodiment of a cooling element.

A further exemplary embodiment of a cooling element is shown in FIG. 5. This exemplary embodiment illustrates an interconnect structure 7a, 7b, which is formed on the carrier 1 of the cooling element, for actuating a number of semiconductor bodies simultaneously. In this case, the metallic surfaces are configured in two parts, with one part 2a in each case including the chip connecting pad 3. The respective other part 2b of the metallic surface is used as a wire connecting pad for making electrical contact between the semiconductor body and a wire connection.

The individual subareas 2a and 2b are each connected to one another by means of interconnects 7a and 7b. This structure makes it possible to test all of the semiconductor bodies mounted in a row, simultaneously and before separation, while they are on the cooling elements and after they have been installed. The interconnect structure can be continued on the carrier 1, for example in a number of parallel runs or in a meandering shape. The arrangement of the components to be tested simultaneously can easily be varied by modification of the interconnect routing. Finally and in particular, it is possible to test all of the semiconductor bodies mounted on a carrier 1 simultaneously, and thus to minimize the test times. In this case, all of the components to be tested can be operated such that they are connected in series, in parallel or in any other circuit combination. This is particularly suitable for the burn-in procedures normally used for laser diodes.

The explanation of the invention based on the described exemplary embodiments should not, of course, be regarded as any restriction of the invention.

The choice of the materials used, in particular of the ceramic material for the carrier 1 and of the metallizations on it, may be varied within wide limits depending on the properties of the semiconductor bodies 11 and on the intended field of use of the components. Furthermore, the variants described in the individual exemplary embodiments can very largely be combined as required.

We claim:

1. A method for producing semiconductor laser components, which comprises:
    providing a cooling element having an electrically insulating carrier that is formed as a plate having a main surface which is covered by a metal coating;
    structuring the metal coating to form a plurality of chip mounting areas;
    fitting a plurality of semiconductor laser chips on the plurality of the chip mounting areas; and
    subdividing the cooling element into a plurality of semiconductor laser components that each include at least one of the plurality of the semiconductor laser chips and a part of the cooling element.

2. The method according to claim 1, which comprises providing the carrier with a ceramic material.

3. The method according to claim 1, which comprises:
    providing the carrier with a plurality of layers in which one of the plurality of the layers is adjacent the main surface; and
    providing at least the one of the plurality of the layers that is adjacent to the main surface as an electrically insulating layer.

4. The method according to claim 1, which comprises constructing the carrier with a material selected from the group consisting of AlN and BN.

5. The method according to claim 1, which comprises configuring the plurality of the chip mounting areas in a matrix form.

6. The method according to claim 1, which comprises performing the structuring step by etching the metal coating.

7. The method according to claim 1, which comprises providing at least some of the plurality of the chip mounting areas with a surface treatment.

8. The method according to claim 1, which comprises providing the metal coating with a plurality of layers.

9. The method according to claim 1, which comprises providing the metal coating with copper.

10. The method according to claim 1, which comprises:
    before performing the fitting step, providing the plurality of the chip mounting areas with a plurality of connecting pads; and
    performing the fitting step by configuring the plurality of the semiconductor laser chips on the plurality of the connecting pads.

11. The method according to claim 10, which comprises providing the plurality of the connecting pads with AuSn.

12. The method according to claim 11, which comprises before performing the fitting step, covering the plurality of the connecting pads with an electrically conductive adhesive material.

13. The method according to claim 10, which comprises before performing the fitting step, covering the plurality of the connecting pads with an electrically conductive adhesive material.

14. The method according to claim 13, which comprises providing the electrically conductive adhesive material as a solder coating.

15. The method according to claim 1, which comprises performing the fitting step by soldering on the plurality of the semiconductor laser chips.

16. The method according to claim 1, which comprises performing the fitting step by soldering on the plurality of the semiconductor laser chips using a hard solder.

17. The method according to claim 1, which comprises forming interconnect structures on the main surface between individual ones of the plurality of the chip mounting areas.

18. The method according to claim 1, which comprises:
    opposite the main surface, forming a plurality of metal surfaces on the carrier; and
    associating the plurality of the metal surfaces with the plurality of the chip mounting areas.

19. The method according to claim 1, which comprises providing the cooling element with a thermal coefficient of expansion that is matched to a thermal coefficient of expansion of the plurality of the semiconductor laser chips.

20. The method according to claim 1, which comprises before the structuring step, forming weak points between the plurality of the chip mounting areas.

21. The method according to claim 20, which comprises forming the weak points by performing a process selected from the group consisting of scratching, milling, and laser ablation.

22. The method according to claim 1, which comprises providing the plurality of the semiconductor chips as GaAs laser diodes.

23. The method according to claim 1, which comprises providing the plurality of the semiconductor chips as high-power GaAs laser diodes.

24. The method according to claim 1, which comprises before performing the subdividing step, fitting a plurality of optical elements, which are associated with the plurality of the semiconductor laser chips, to the cooling element.

25. The method according to claim 1, which comprises in between the fitting step and the subdividing step, testing the plurality of the semiconductor laser chips.

26. The method according to claim 25, which comprises performing the testing step by including a test of an optical functionality of the plurality of the semiconductor laser chips.

27. The method according to claim 25, which comprises performing the testing step by including a burn-in cycle of the plurality of the semiconductor laser chips.

28. The method according to claim 25, which comprises performing the testing step by including a quality selection of the plurality of the semiconductor laser chips.

29. The method according to claim 25, which comprises performing the testing step by simultaneously testing at least some of the plurality of the semiconductor laser chips.

* * * * *